United States Patent [19] [11] 4,424,102
Brandeis et al. [45] Jan. 3, 1984

[54] REACTOR FOR REACTIVE ION ETCHING AND ETCHING METHOD

[75] Inventors: Christine Brandeis, Sindelfingen; Jurgen Kempf, Schonaich; Georg Kraus, Wildeberg; Ulrich Künzel, Kusterdingen, all of Fed. Rep. of Germany

[73] Assignee: International Business Machines Corporation, Armonk, N.Y.

[21] Appl. No.: 479,405

[22] Filed: Mar. 28, 1983

[30] Foreign Application Priority Data

Mar. 31, 1982 [EP] European Pat. Off. ........ 82102719.0

[51] Int. Cl.³ .............................................. C23C 15/00
[52] U.S. Cl. ............................ 204/192 E; 204/192 R; 204/298
[58] Field of Search ................ 204/298, 292 R, 292 E

[56] References Cited

U.S. PATENT DOCUMENTS

| | | | |
|---|---|---|---|
| 3,369,991 | 2/1968 | Davidse et al. | 204/298 |
| 4,070,264 | 1/1978 | Loiseau et al. | 204/192 |
| 4,158,589 | 6/1979 | Keller et al. | 156/345 |
| 4,275,126 | 6/1981 | Bergmann et al. | 204/298 |
| 4,309,266 | 1/1982 | Nakamura et al. | 204/298 |
| 4,381,453 | 4/1983 | Cuomo et al. | 204/298 |
| 4,381,965 | 5/1983 | Maher et al. | 204/298 |

FOREIGN PATENT DOCUMENTS

| | | | |
|---|---|---|---|
| 3020 | 11/1979 | European Pat. Off. | 204/298 |
| 2722708 | 8/1977 | Fed. Rep. of Germany | 204/298 |
| 551498 | 5/1974 | Switzerland | 204/298 |

*Primary Examiner*—Arthur P. Demers
*Attorney, Agent, or Firm*—Henry Powers

[57] ABSTRACT

A reactor comprising a plate-shaped cathode that is horizontally arranged and connected to an alternating voltage, in a ground connected casing, and gas inlet and gas outlet lines. The cathode is equipped with means for generating local magnetic fields restricted to the region of the individually supported substrates. The cathode can be furthermore have holes or openings in which are arranged substrate holders shiftable or movable vertically to relate to the substrate surface.

The substrates are etched in the reactor by means of a plasma which is produced from at least one reactive gas. Each substrate is exposed to at least one local magnetic field. If a mostly chemically etchable material is to be etched in the presence of a mostly physically etchable material, to a much stronger extent than the latter, the advantageous etching speed ratio can be set in that the substrates are additionally raised over the cathode surface.

10 Claims, 2 Drawing Figures

REACTOR FOR REACTIVE ION ETCHING AND ETCHING METHOD

FIELD OF THE INVENTION

The invention relates to a reactor for reactive ion etching comprised of a reaction chamber surrounded by a casing which is connected to ground and including at least one gas inlet and one gas outlet, and wherein a plate-shaped cathode is arranged horizontally over which there is a space wherein the plasma is sustained, and on which the subtrate work-pieces are placed, and to a method of etching substrates using such a reactor, where the substrates are exposed to the ionized particles produced in a plasma made of reactive gas.

DESCRIPTION OF THE PRIOR ART

The above reactor and such method are described e.g. in U.S. Pat. No. 3,994,793. An article referring to the kinetics of reactive ion etching has been published by J. L. Mauer and J. S. Logan, entitled "Reactant Supply in Reactive Ion Etching" in the Journal of Vac. Sci. Technol. 16(2), Mar./Apr. 1979, p. 404 ff.

The above defined reactor, for reactive ion etching, is suitable for etching flat substrates, as e.g. semiconductor wafers. In one reactor, the casing is the anode; and between anode and cathode a plasma produced from reactive gases is introduced in the reactor wherein it is sustained. A plate which is conductively connected to the casing and arranged in parallel to the cathode can also be used as an anode, but if the casing is used as the anode the anode surface is bigger than the casing surface. This is an advantage, for the larger the surface ratio of anode and cathode, the higher the voltage drop at the cathode, and a high voltage drop at the cathode means high kinetic energy of the ionized particles impinging on the cathode, or on the substrates supported on the cathode. In reactive ion etching, which is preferably used in those cathodes where holes or openings with exactly vertical walls are to be etched, ionized particles with a high kinetic energy are desirable, apart from a large mean free path of the ionized particles, which is effected by a correspondingly low pressure in the reactive chamber. In reactive ion etching, removal is effected on the one hand physically, i.e. owing to the kinetic energy of the impinging ionized particles, and on the other it is effected chemically, i.e. owing to a reaction of the ionized particles in the plasma with the material to be etched (ion-induced chemical etching). Depending on which one of the two processes is rate determining in the removal of a predetermined material, the material used is referred to as a mostly physically, or mostly chemically etchable material. Silicon, to give an example, is a material which in an atmosphere containing chlorine and helium is mostly chemically etchable. If silicon or e.g. a silicon wafer is exposed to an atmosphere containing chlorine or helium in the reactor for the reactive ion etching, with a plasma being produced out of the reactive gas, an $SiCl_2$-film forms on the silicon surface. The $SiCl_2$-radicals are removed physically owing to the sputtering effect of the impinging ionized particles. The $SiCl_2$-radicals react in the plasma into $SiCl_4$, and are pumped off. Etching is effected strictly anisotropically, i.e. precisely perpendicular to the surface to be etched. Contrary thereto, $SiO_2$ is etched under these conditions mostly physically (cathode sputtering etching).

Reactive ion etching is advantageous not only because it permits a strictly anisotropic etching, but also—this advantage applies in particular if compared with wet chemical etching—because in its use the extent of impurities of the part to be etched is negligible. A problem in connection with reactive ion etching is the relatively low speed of the removing process (high radiation exposure, long process times) so that improvements of the process in that direction are desirable.

SUMMARY OF THE INVENTION

It is the object of the invention to provide a reactor for reactive ion etching, and an etching method using such a reactor to achieve a higher etching speed than in prior art units without affecting the quality of etching.

This object is achieved with a reactor of the above specified type utilizing localized magnetic fields at and around each cathode supported substrate in spaced relationship to other substrate areas wherein the use of the reactor decouples the macroscopic burning effects of the plasma from local etching effects on the substrates.

Using the reactor as disclosed in this invention ensures a higher etching rate than in connection with those of the prior art. The uniformity of etching is of the same quality as in connection with known methods using known reactors. The field lines acting on the substrates can be vertical, and/or parallel to the substrate surfaces. Magnetic fields whose magnetice induction is in the order of $5 \times 10^{31}$ 2 T increase the etching speed of the mostly chemically etchable materials by a factor of 1.2 approximately. If the field lines extend in parallel to the substrate surface, the most physically etchable materials are also etched with a rate increased by a factor of 1.2 approximately, and if the field lines extend perpendicularly to the substrate surface, they are etched with a rate increased by a factor of 2. The magnetic field with the field lines parallel to the substrate surface effects a change of the angle of incidence and of the trajectory (cyclotron-effect) of the ions and electrons of the plasma. This increases the probability of ionization of the particles, and their kinetic energy. Due to a variation of the magnetic field, the actual etching effect is locally controllable. Through the magnetic field whose field lines extend vertically to the substrate surface the density of the incident charge particles in the location of the substrate can be increased (plasma pinch effect).

Using the reactor disclosed by the invention it is possible, as specified above, to decouple by means of the method as disclosed by the invention the macroscopic burning behaviour which is determined by pressure, gas flow, and HF rate of the plasma from the local etching behaviour in the location of the substrates. In other words, the plasma serves mostly as a source for for the reactive particles, whereas according to the invention the etching process is controlled directly at the location of the substrates.

The reactor as disclosed by the invention is advantageously designed in such a manner that each substrate is located on a substrate holder that is electrically insulated from the cathode, and that each substrate holder is arranged in one respective through-hole or opening in the cathode, and can be shifted or moved vertically relative to the cathode surface, and that the means for producing the magnetic fields are provided in the substrate holders. This embodiment of the reactor as disclosed by the invention is of particular advantage if a mostly chemically etchable material, in the presence of a mostly physically etchable material, is to be exposed to a much faster etching than the latter. The method, applied advantageously, results in the ability that the substrates to be etched are raised over the plane of the cathode surface. Via this raising of the substrates the kinetic energy of the ions and electrons arriving on the substrates can be influenced. If e.g. the substrates are raised to such a level that they are above the dark space over the cathode surface, and if the same conditions are applied as in prior art reactive ion etching, i.e. if no magnetic field is applied, the etching speed is drastically reduced since the particles before impinging on the substrates traverse only a very low voltage difference and therefore have a correspondingly low kinetic energy. However, if the substrates are additionally exposed to a local magnetic field according to the invention, the reduction of the etching speed caused by the raising can practically be fully compensated for the mostly chemically etchable materials, but for the mostly physically etchable materials it can only be raised to a level which is smaller by a factor of 3 to 4 than the etching speed of these materials if the substrates have not been raised. This effect achieved through the co-acting of the raising and the applying of the magnetic fields presents precisely the desired result, i.e. that the mostly chemically etchable material is exposed to a much faster etching than the mostly physically etchable material. This embodiment of the reactor as disclosed by the invention, and of the etching process as disclosed by the invention avoids a specific feature of the known reactors for reactive ion etching which consists in that the sputtering and the chemical effect of reactive ion etching are interconnected via the behaviour of the plasma. In the known reactors, neither the one nor the other effect can be influenced without the other effect being simultaneously altered, too.

Further advantageous embodiments of the reactor as disclosed by the invention and the method as disclosed herein by the invention are defined and described below.

BRIEF DESCRIPTION OF THE DRAWINGS

The invention will be described below with reference to embodiments illustrated by the accompanying drawings which form a material part of this disclosure. The drawings show the following.

DESCRIPTION OF THE PREFERRED EMBODIMENTS

For further comprehension of the invention, and of the objects and advantages thereof, reference will be had to the following description and accompanying drawings and to the appended claims in which the novel features of the invention are more particularly set forth.

Unlike the known reactors for reactive ion etching, the reactor as disclosed by this invention comprises means which make it possible that each substrate to be etched can be exposed to magnetic fields which are restricted to the region of the respective substrate, and whose field lines extend vertically and/or in parallel to the field lines of the electrical field between cathode and anode. These means are dimensioned in such a manner that all magnetic field lines in the region of the substrate surface extend either in parallel or vertically to the substrate surface. The magnetic fields extending vertically to the electrical field, to give an example, are generated by means of a permanent magnet or by means of a coil, and the magnetic fields parallel to the electrical field are generated e.g. by means of a coil. The above mentioned means for generating the magnetic fields are arranged below the substrates.

In the following, an embodiment of the reactor as disclosed by the invention which comprises an additional feature will now be discussed with reference to FIGS. 1 and 2.

Figure 1:
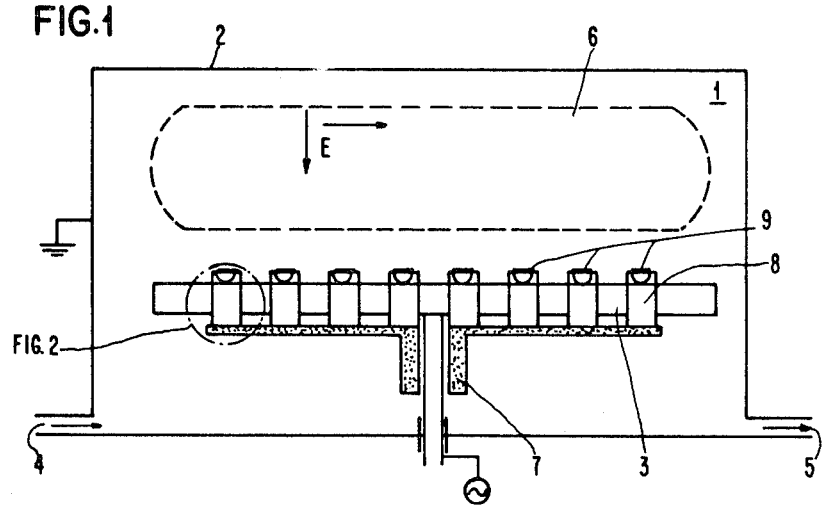
FIG. 1 is a schematic cross-section through an embodiment of the arrangement as disclosed by the invention.

FIG. 1 depicts a cross-section through the reaction chamber 1 of the reactor. Reaction chamber 1 is surrounded by casing 2 which is connected to ground. Reaction chamber 1 contains a plate-shaped, horizontally arranged cathode 3 applied to a high frequency alternating voltage. Casing 2 serves as the anode of the reactor. However, it is also possible to use as a counter-electrode a plate which is arranged in parallel to the cathode within reaction chamber 1, and which is connected to ground, or to a settable potential. Reaction chamber 1 has at least one gas inlet 4 and one gas outlet 5 through which the gases in reaction chamber 1 can be pumped off by means of a vacuum pump (not shown). The space wherein plasma 6 is produced during the operation of the reactor is between the cathode and the upper horizontal part of casing 2, or of the anode plate. Reference numbers 7 and 8 refer to two parts in the FIG. 1 which are characteristic for a specified embodiment of the reactor as disclosed by the invention. Reference No. 7 refers to a lifting device raising and lowering the substrate holders marked with reference number 8 which are arranged in openings or through-holes in cathode 3. Placed onto substrate holders 8 are substrates 9 which by means of lifting device 7 can be lifted from the cathode surface in the direction of the anode. The substrate holders are on a floating potential.

Figure 2:
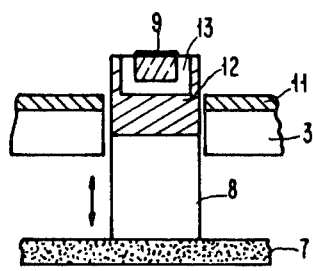
FIG. 2 shows the encircled part of FIG. 1, in an enlarged presentation.

FIG. 2 shows an enlargement of the part encircled in FIG. 1. FIG. 2 depicts a region of cathode 3 with a hole containing a substrate holder 8 placed on lifting device 7. The surface of cathode 3 is covered with a preferably several millimeters thick layer 11 of a dielectric material, preferably quartz. Upper part 12 of substrate holder 8 also consists of a dielectric material, again preferably quartz. Incorporated in upper part 12 of substrate holder 8 is the means for producing the magnetic field or fields are provided. FIG. 2 contains as an example for the above mentioned means a permanent magnet 13 in upper part 12 which generates a magnetic field whose field lines extend, in the region of substrate 9 placed on upper part 12, in parallel to the cathode surface. Instead of a permanent magnet 13, upper part 12 can also contain a coil, whose axis extends in parallel to the cathode surface. Further embodiments of the reactor as disclosed by the invention can be designed in such a manner that for producing a magnetic field whose field lines extend vertically to the cathode surface, upper part 12 contains a coil whose axis is vertical to the cathode surface, or two coils, one generating a magnetic field with field lines vertical to the cathode surface. In the latter embodiment of the reactor as disclosed by the invention, one of the coils can be replaced by a permanent magnet.

The method as disclosed by the invention differs from the known etching processes, by means of reactive ions, in the use of local magnetic fields at the location of the substrates to be etched. If a magnetic field is applied whose fields extend in parallel to the cathode surface, with a magnetic induction in the order of $5\times10^{-2}T$ with otherwise the same parameters (gas flow, electric line, pressure in the reaction chamber, substrate temperature and etching period) as in the known method, the increase of the etching speed is about the same, for materials mostly etched physically, as well as for materials mostly etched chemically. If a magnetic field is applied whose field lines extend in parallel to the field lines of the electric field, and whose magnetic induction is also in the order of the $5\times10^{-2}T$ the etching rate (provided the other parameters are the same as in the known methods) is again higher than in the known methods. The relative increase of the etching speed is smaller with the mostly chemically etchable materials than with the mostly physically etchable materials. If the substrates are exposed to two magnetic fields simultaneously whose field lines extend in parallel or vertical to the electrical field, and which both have a magnetic induction in the order of $5\times10^{-2}T$, an increase of the etching speed compared with the known methods can also be achieved. In this embodiment of the method as disclosed by the invention the etching speeds of the mostly physically etchable and those of the mostly chemically etchable materials are increased.

The method disclosed by the invention, using the reactor depicted in FIGS. 1 and 2 is applied in particular when a material which is mostly etched physically is to be etched preferably in the presence of another material which is to be etched mostly chemically. This may be decisive in those cases where for the selective etching of the mostly physically etchable material a mask is used which consists of the material which is to be etched mostly physically, or where a very thin layer of the mostly physically etchable material is not to be attacked if a superimposed, mostly chemically etchable material is to be etched. There is an example for the latter case if in the production of a field effect transistor comprising a gate oxide layer of a silicon dioxide, and a polysilicon gate, the gate is to be etched by means of reactive ion etching in an atmosphere containing chlorine and helium, and where silicon is etchable mostly chemically and silicon dioxide mostly physically, without the gate oxide layer being substantially affected. So a feature of particular importance in connection with these methods is a large ratio of speeds for etching on the one hand the material to be etched chemically, and on the other the material to be etched physically. Another important factor is that the mostly chemically etchable material is etched with a speed that suffices for series manufacture, and that etching is effected uniformly. For a detailed specification of the method as disclosed by the invention, using the reactor depicted in FIGS. 1 and 2, the etching of the material combination silicon/silicon dioxide in an atmosphere containing chlorine and helium will be described below. However, the method as disclosed by the invention can also be used advantageously with other material combinations, the selection of the proper etching gas, or etching gases being left to the discretion of the expert. The etching speed ratio in the etching of silicon and silicon dioxide, if a conventional reactor is used, is between 10 and 15 for reactive ion etching. If with otherwise unchanged conditions the substrates are additionally exposed, as disclosed by the invention, to a local magnetic field or local magnetic fields there is an increase, as specified above, of the etching speed for the mostly chemically etchable material, i.e. the silicon, as well as for the mostly physically etchable material, i.e. the silicon dioxide, in the order of 10 to 20%. If the substrates are processed under the same conditions as in the known methods, i.e. without any local magnetic fields being applied, but if they are additionally lifted—with a distance between cathode and anode approximately 8 cm—by means of lifting device 7 for about 20 mm over the cathode surface, there is a very strong reduction of the etching speed of silicon as well as of silicon dioxide. The applying of local magnetic fields, irrespective of whether the magnetic field lines extend vertically, in parallel, or both parallel and vertically to the electric field lines, again causes an increase of the etching speeds in such a manner that the etching speed of the silicon can be raised by a magnetic field whose magnetic induction is in the order of $5\times10^{-2}T$ to values which are only negligibly below those which have been achieved with conventional methods, i.e. without local magnetic fields being applied, and without the substrates being raised over the cathode surface. This is not so in the case of silicon dioxide whose etching speed can be increased by the local magnetic fields from the low value measured in the raised position but without any magnetic field being applied, to a value which is smaller by a factor of 3 to 4 only than in the known methods. This result is very advantageous, because it provides a ratio of the etching speeds of silicon and silicon dioxide between 40 and 50 without a reduced etching speed for the silicon, or a loss of homogeneity. As a consequence of this result, masking layers of silicon dioxide can be made much thinner for the etching of silicon, with the positive consequence that the sample elements can be transferred to the silicon dioxide mask with greater fidelity. Furthermore, the risk of gate oxide layers being greatly affected during the structurization of polysilicon gates can be reduced to a minimum.

In the following, the method as disclosed by the invention, and as implemented by using the reactor of FIGS. 1 and 2 will be explained in detail with reference to nine examples, where the method as disclosed by the invention is applied on silicon wafers selectively masked with a silicon dioxide layer. In all nine examples, the following method parameters were the same;

Helium-chlorine mixtures with 50 ml helium and 5 ml chlorine/min.; (*)
power 1000 Watt;
pressure approximately 1.3 U bar;
time 100 minutes;
substrate temperature: approx. room temperature electrode spacing about 8 cm.

(*) under standard conditions

Those parameters which differ in the nine examples, as well as the achieved etching speed, or the achieved etching speed ratios are listed in the following table.

| Run Nos. | Substrate spacing to cathode surface (nm) | Magnetic field $\vec{H}$ ($\perp$ to $\vec{E}$) | ($\parallel$ to $\vec{E}$) | Etching speed (nm/min.) Si | SiO$_2$ | Etching speed ratio Si:SiO$_2$ |
|---|---|---|---|---|---|---|
| 1 | 0 | — | — | 50 | 3.5 | 10–15 |
| 2 | 8 | — | — | 52 | * | |
| 3 | 20 | — | — | 1 | −2.6/−3.2 | |
| 4 | 0 | + | — | 58 | 4 | 14.5 |
| 5 | 8 | + | — | * | 1,0 | |
| 6 | 20 | + | — | 43 | −1.2 | 40–50 |
| 7 | 0 | — | + | 65 | 7 | 8–10 |
| 8 | 8 | — | + | 61 | 6 | 8–10 |

| Run Nos. | Substrate spacing to cathode surface (nm) | Magnetic field $\underline{H}$ ($\perp$ to $\vec{E}$) (11 to $\vec{E}$) | Etching speed (nm/min.) Si | SiO$_2$ | Etching speed ratio Si:SiO$_2$ |
|---|---|---|---|---|---|
| 9 | 20 | — + | 47 | 1.3 | 36 |

*no measured value available

The removed silicon and silicon dioxide layer thicknesses were determined interferometrically, or by means of a mechanically operating step gauge, respectively, and the etching speeds were deduced therefrom. It was furthermore found that the uniformity of the etching was of the same quality as in connection with the known methods using known reactors for reactive ion etching. The results given in the table show that a raising of the substrates by approximately 8 mm has a low effect, but the raising by 20 mm has a very great effect. This is assumed to be due to the fact that with a raising by 20 mm the substrates are already above the dark space. In the dark space, there is a great voltage drop which transmits to the ionized particles in the direction of the cathode a high kinetic energy. Substrates which are above the dark space are therefore exposed to particles with a much lower kinetic energy than substrates exposed directly onto the cathode, or raised out of the plane of the cathode surface by a few mm only. The low kinetic energy of the ionized particles, and the low electron density above the dark space obviously causes for run 3 the low etching speed of the silicon, and the overcompensation of etching through a re-deposition of already removed particles for the silicon dioxide. The table (see runs 6 and 9) however shows that local magnetic fields with magnetic field lines extending in parallel to or vertically to the electric field lines whose magnetic induction is in the order of $5 \times 10^{-2}$T, increases again the etching speed of the silicon to a value which is only slightly lower than that which had been measured with the substrates placed directly on the cathode surface, and not exposed to any magnetic field. However, as also shown in Runs 6 and 9, the magnetic fields act less strongly on the speed with which the mostly physically etchable silicon dioxide is etched, with the desired consequence that the etching speed of the silicon is 40 to 50 times higher than that of the silicon dioxide. The other results in the table (see examples 4, 5, 7 and 8) confirm the above discussed effects of the local magnetic fields with respect to the substrates, also in those cases where the substrates are not raised out of the plane of the cathode.

While the invention has been illustrated and described with preferred embodiments of this invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. A plasma apparatus suitable for a plurality of spaced reactive ion etching substrates comprising:
   a vacuum chamber,
   means for creating a plasma of ions reactive with said substrates and applying a potential between said plasma and said substrates, and a localized means to generate magnetic fields at and across each of said substrates in spaced relationship to other substrates.

2. The apparatus of claim 1 including an electrode for supporting said substrates in spaced relationship to each other, means electrically insulated from said electrode for raising said substrate relative to the surface of said electrode.

3. The apparatus of claim 2 wherein said electrode comprises a planar cathode have a plurality of aperatures corresponding to the number of said substrates employed, and having mounted in said aperature said substrate elevating means, with said magnetic field generating means mounted in said elevating means.

4. The apparatus of claim 3 wherein magnetic field generating means are selected to form at least one of magnetic field lines parallel and vertical to the surfaces of said substrates.

5. The apparatus of claim 4 wherein the top surface of said cathode is coated with a dielectric, and said elevating means comprises a dielectric substrate support at least in the upper portions thereof.

6. In a plasma reactor having two opposed parallel electrodes, means on one said electrode for individually supporting substrates in spaced relationship to each other, means for displacing said substrate between and into the space between said electrodes and relative to one of said electrodes, and means for generating individual electric fields at each of substrates.

7. A method for etching substrates in a plasma formed between an anode and a cathode electrodes comprising;
   Dispersing a plurality of substrates on one of said electrodes, generating individual magnetic fields at and across each of said substrates in spaced relationship to other of other said fields and said substrates, and controllably elevating said substrates relative to said one electrode and the dark space of said plasma.

8. The method of claim 7 including electrically insulating said substrate from said one electrode.

9. The method of claim 8 wherein said magnetic field is formed to produce field lines parallel to the surface of said substrates.

10. The method of claim 8 wherein said magnetic field is formed to produce field lines vertical to the surfaces of said substrates.

* * * * *